United States Patent
Webster et al.

(10) Patent No.: US 7,408,205 B2
(45) Date of Patent: Aug. 5, 2008

(54) DIGITAL CAMERA MODULE

(75) Inventors: Steven Webster, Maio-li (TW);
Ying-Cheng Wu, Maio-li (TW)

(73) Assignee: Altus Technology Inc., Chu-Nan, Miao-Li Hsien (TW)

(*) Notice: Subject to any disclaimer, the term of this patent is extended or adjusted under 35 U.S.C. 154(b) by 30 days.

(21) Appl. No.: 11/525,447

(22) Filed: Sep. 22, 2006

(65) Prior Publication Data
US 2007/0126081 A1 Jun. 7, 2007

(30) Foreign Application Priority Data
Dec. 2, 2005 (CN) .......................... 200510102024

(51) Int. Cl.
H01L 29/22 (2006.01)
H01L 33/00 (2006.01)
H01L 29/227 (2006.01)
H01L 29/24 (2006.01)
H01L 23/495 (2006.01)
H01L 23/02 (2006.01)

(52) U.S. Cl. .............................. 257/99; 257/95; 257/98; 257/100; 257/666; 257/680

(58) Field of Classification Search .................. 257/95, 257/98–100, 666, 668, 680
See application file for complete search history.

(56) References Cited

U.S. PATENT DOCUMENTS

| | | | |
|---|---|---|---|
| 6,518,656 B1* | 2/2003 | Nakayama et al. | 257/680 |
| 6,870,208 B1* | 3/2005 | You et al. | 257/291 |
| 7,095,621 B2* | 8/2006 | Saimun et al. | 361/772 |
| 7,227,236 B1* | 6/2007 | Lee et al. | 257/433 |
| 2005/0139846 A1* | 6/2005 | Park et al. | 257/98 |
| 2006/0071222 A1* | 4/2006 | Yatsuda et al. | 257/90 |
| 2006/0103953 A1* | 5/2006 | Lee et al. | 359/819 |
| 2007/0034887 A1* | 2/2007 | Pang et al. | 257/98 |
| 2007/0040932 A1* | 2/2007 | Chen | 348/374 |
| 2007/0096312 A1* | 5/2007 | Humpston et al. | 257/734 |
| 2007/0114547 A1* | 5/2007 | Fujita et al. | 257/98 |

* cited by examiner

*Primary Examiner*—Ira M Soward

(57) ABSTRACT

A digital camera module (200) includes a carrier (20), an image sensor chip (30), a number of wires (50), a holder (60), and a lens module (70). The carrier includes a base (21) and a leadframe (23) embedded in the base. The base includes a board (211), a sidewall (213) and a cavity (24). The leadframe includes a number of conductive leads (233) spaced from each other. Each lead has a first terminal portion (235), a second terminal portion (236), and an interconnecting portion (237) connecting the first and second terminal portions. The chip is mounted on the carrier, and has an active area (301). The wires electrically connect the chip and the leadframe. The holder is mounted to the carrier to close the cavity. The lens module is received in the holder and guides light to the active area of the chip.

14 Claims, 4 Drawing Sheets

DIGITAL CAMERA MODULE

CROSS-REFERENCE TO RELATED APPLICATIONS

This application is related to a co-pending U.S. patent application Ser. No. 11/525,446, entitled "IMAGE SENSOR CHIP PACKAGE", by Steven Webster et al. Such application has the same assignee as the present application and has been concurrently filed herewith. The disclosure of the above identified application is incorporated herein by reference.

TECHNICAL FIELD

The present invention generally relates to camera modules, and more particularly to a digital camera module suitable for portable electronic devices such as mobile phones, personal digital assistants (PDAs) and the like.

BACKGROUND

Generally, digital cameras are image recording media capable of photographing a plurality of still images without using film. Such a digital camera typically uses an image pickup device, which is a kind of semiconductor device, such as a charge coupled device (CCD) or complementary metal oxide semiconductor (CMOS). In the digital camera, an object image formed on the image pickup device through a lens is converted into an electrical signal by the image pickup device, and the electrical signal is stored as a digital signal in a mobile phone or PDA in which the digital camera is mounted. In order to protect the image pickup device from contamination or pollution (i.e. from dust or water vapor), the image pickup device is generally sealed in a structural package.

A typical image sensor chip package 100 is illustrated in FIG. 1. The image sensor chip package 100 is constructed to include a base 10, a chip 12, a plurality of wires 13, an adhesive glue 14 and a cover 15. The base 10 includes a board portion 101, a frame portion 102 upwardly extending from a periphery of the board portion 101, and a cavity 103 cooperatively formed by the board portion 101 and the frame portion 102. A plurality of top contacts 104 and bottom contacts 105 are respectively mounted on two sides of the board portion 101, and the top contacts 104 are contained in the cavity 103. A plurality of conductive interconnecting portions 106 are arranged inside the board portion 101 so as to electrically connect the top and bottom contacts 104, 105. The chip 12 includes an active area 121 and a number of pads 122 formed thereon. The chip 152 is received in the cavity 103 and adhered to the board portion 101 of the base 10. The wires 13 are provided to electrically connect the pads 122 of the chip 12 and the top contacts 104 of the base 10. The cover 15 is transparent and secured to the top of the frame portion 102 via the adhesive glue 14, thereby hermetically sealing the cavity 103 and allowing light beams to pass therethrough.

In the foresaid package 100, the base 10 is essentially made from ceramic, which is expensive and accordingly results in increased cost of the package 100. During the process of forming the contacts 104, 105 and the interconnecting portions 106 on the base 10, firstly a number of interconnection holes are punched in the base 10, secondly, the base 10 is copper plated, via electroless or electrolytic deposition onto the surface of the base 10 and onto the surfaces created by the interconnecting holes. Finally, the contacts 104, 105 are formed by means of etching. Accordingly, the contacts 104, 105 and the interconnecting portions 106 are electrically connected with each other. It is obvious that this method of forming the contacts 104, 105 and the interconnecting portions 106 is complex and as a result it is expensive. Furthermore, water vapor can enter the cavity 103 via the interconnection portions 106. Thus, the chip 12 may become polluted, and even be damaged.

Additionally, the cavity 103 of the base 10 must contain both of the top contacts 104 and the chip 12 therein, and there must be a space between an outer periphery of the chip 12 and an inner periphery of the frame portion 102 of the base 10 for allowing movement of a wire bonding tool, which accordingly results in a relatively large sized package 100 relative to the volume of the chip 12.

Furthermore, the relatively large volume of the package 100 results in more dust-particles adhering to the cover 15, the board portion 101 and the frame portion 102 of the base 10. Thus, more dust-particles will drop onto the chip 12. The dust-particles obscure the optical path and produce errors in the image sensing process. Accordingly, the quality and/or reliability of the package 100 may be adversely affected.

Therefore, a digital camera module with an improved image sensor chip package is desired in order to overcome the above-described shortcomings.

SUMMARY OF THE INVENTION

In one aspect, digital camera module includes a carrier, an image sensor chip, a number of wires, a holder and a lens module. The carrier includes a base and a leadframe embedded in the base. The base has a board, a sidewall extending from a top surface of the board and a cavity cooperatively defined by the board and the sidewall. The leadframe includes a plurality of conductive leads spaced from each other. Each conductive lead has a first terminal portion exposed from a top surface of the sidewall of the base, a second terminal portion exposed through a bottom surface of the board, and an interconnecting portion connecting the first and second terminal portion. The chip is mounted on the base and received in the cavity, and includes an active area and a plurality of contacts. The wires electrically connect the contacts of the chip and the first terminal portions of the leadframe. The holder is mounted on the carrier to enclose the cavity of the carrier. The lens module is received in the holder and guides light to the active area of the chip.

Other advantages and novel features will become more apparent from the following detailed description when taken in conjunction with the accompanying drawings.

BRIEF DESCRIPTION OF THE DRAWINGS

Many aspects of the present digital camera module can be better understood with reference to the following drawings. The components in the drawings are not necessarily drawn to scale, the emphasis instead being placed upon clearly illustrating the principles of the digital camera module. Moreover, in the drawings, like reference numerals designate corresponding parts throughout the several views.

DETAILED DESCRIPTION OF THE PREFERRED EMBODIMENTS

Figure 1:
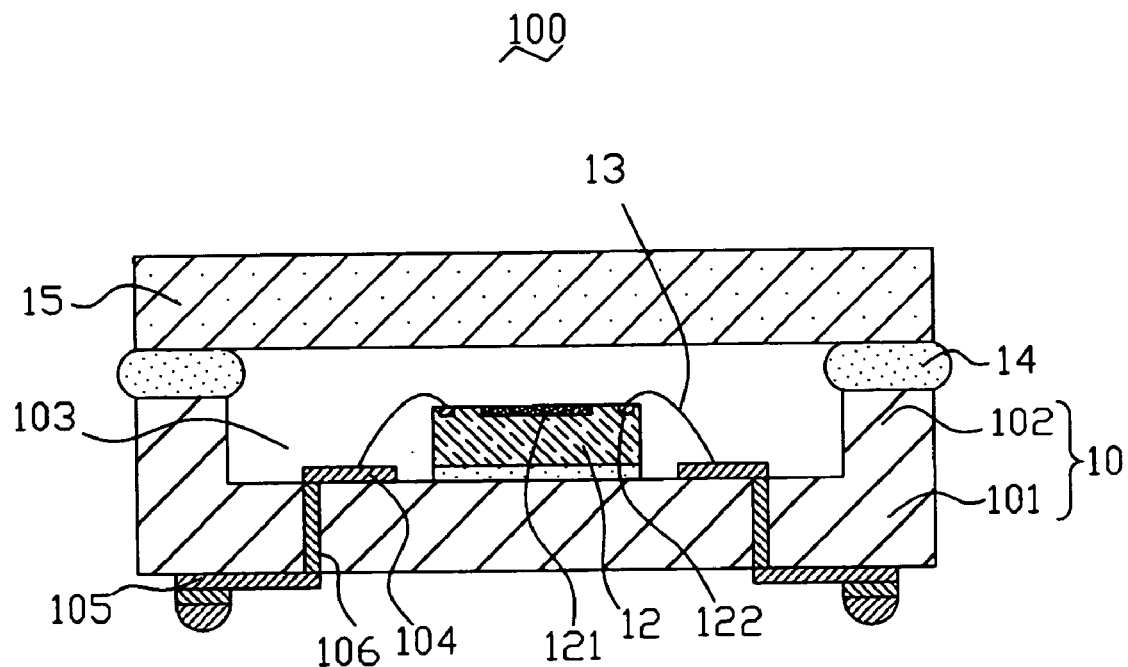
FIG. 1 is a schematic, cross-sectional view of a typical image sensor chip package.
Figure 2:
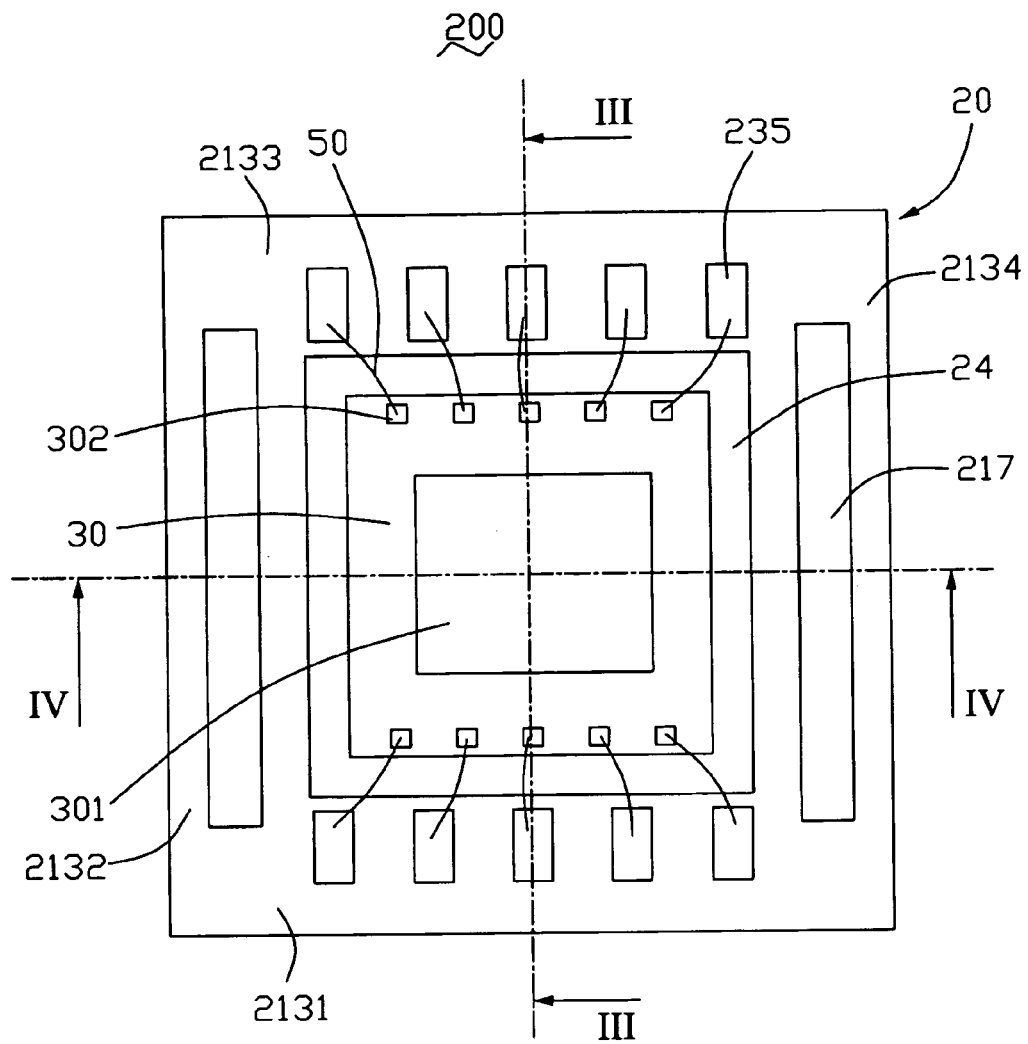
FIG. 2 is a schematic, top plan view of a digital camera module according to a preferred embodiment, wherein a holder and a lens module of the digital camera module are not shown.
Figure 3:
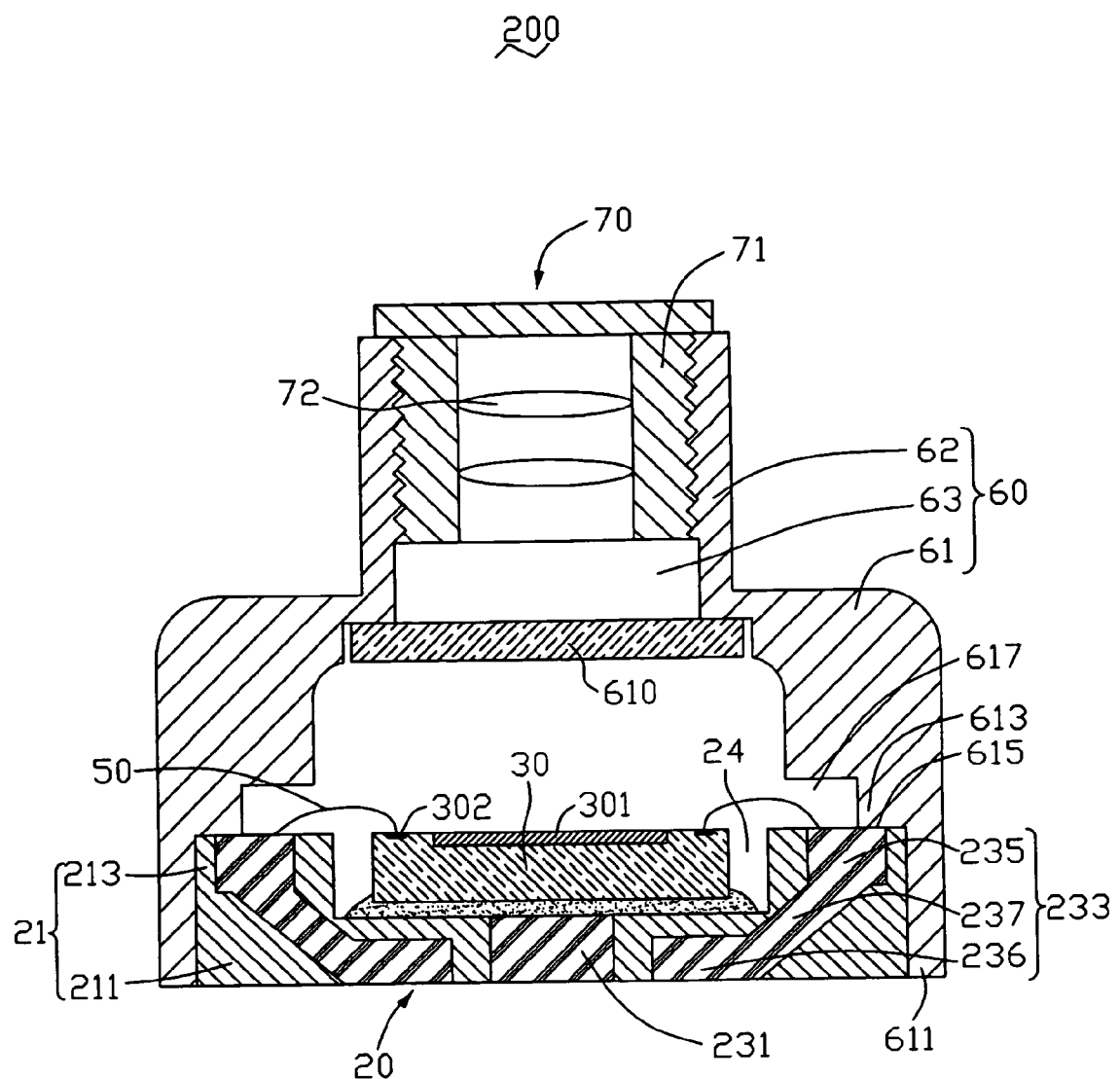
FIG. 3 is a cross-sectional view of the digital camera module in FIG. 2 along a line III-III, wherein the holder and the lens module are shown.
Figure 4:
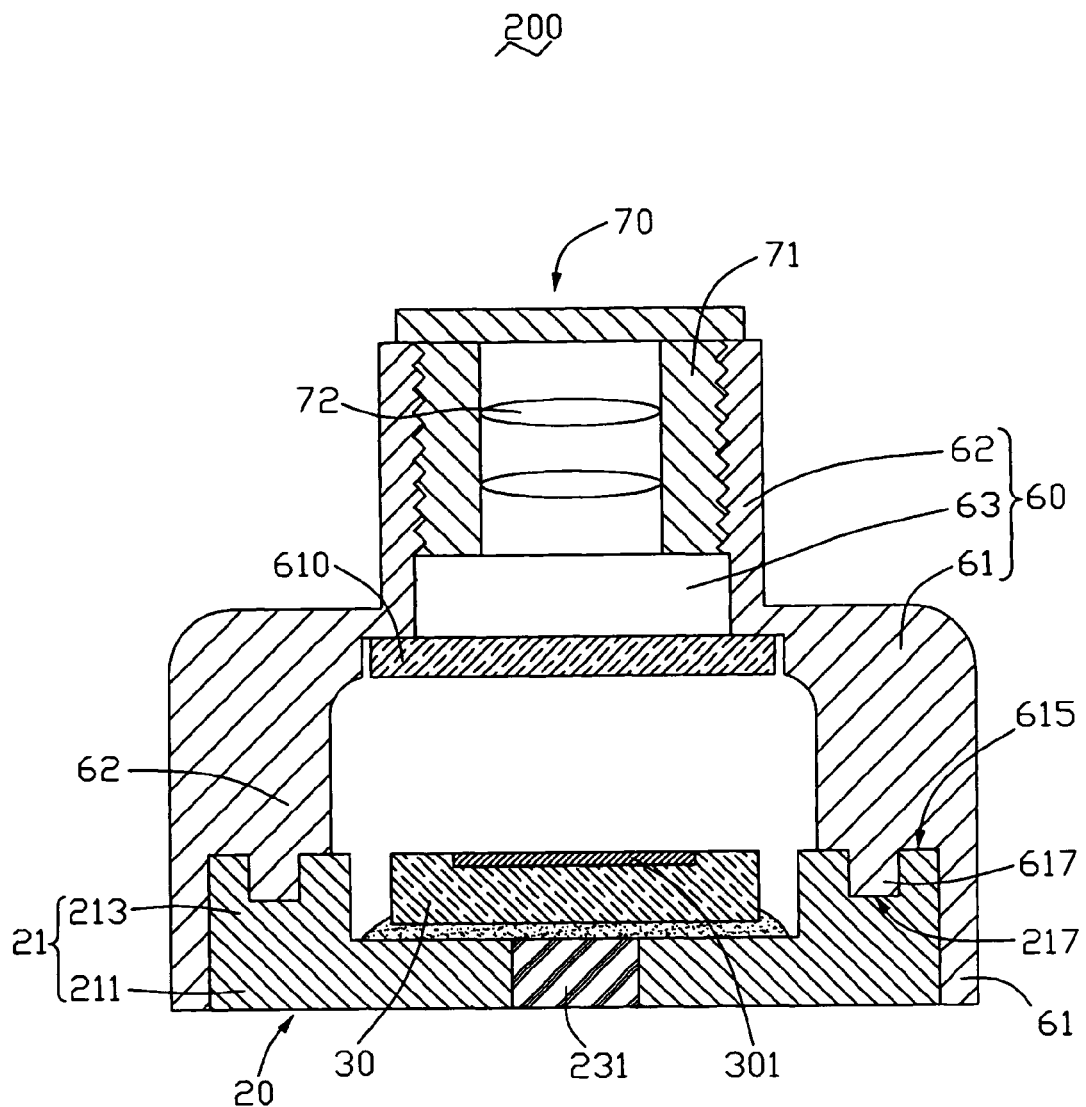
FIG. 4 is a cross-sectional view of the digital camera module in FIG. 2 along a line IV-IV, wherein the holder and the lens module are shown.

Referring to FIGS. 2 through 4, a digital camera module 200 in accordance with a preferred embodiment is illustrated. The digital camera module 200 is configured (i.e. structured or arranged) for including an image sensor chip package (not labeled) and a lens module 70, wherein the image sensor chip package includes a carrier 20, a chip 30, a number of bonding wires 50 and a holder 60.

The carrier 20 of the image sensor chip package includes a plastic base 21 and a leadframe (not labeled). The leadframe and the plastic base 21 cooperatively form the carrier 20 by injection molding.

The base 21 is essentially made from plastic materials such as polyphenylene oxide (PPO), polyphenylene sulfide (PPS) and the like. The base 21 may have various perimeter shapes, such as a square, rectangular, a circular etc. The base 21 includes a base board 211, a sidewall 213 upwardly extending from a periphery of the base board 211, and a cavity 24 cooperatively formed by the base board 211 and the sidewall 213 for receiving electronic components. As shown in FIG. 2, the sidewall 213 includes a front sidewall portion 2131, a rear sidewall portion 2133 positioned opposite to the front sidewall portion 2131, a left sidewall portion 2132, and a right sidewall portion 2134 positioned opposite to the left sidewall portion 2134. The top surfaces of two opposite sidewall portions of the sidewall 213, such as the left and right sidewall portion 2132, 2134, each have a slot 217 longitudinally defined therein. The cavity 24 has a uniform cross section between the base board 211 and the sidewall 213.

Referring to FIGS. 3 and 4, the leadframe is made of conductive metal material, which has good electrical conductivity and thermal conductivity, such as copper or iron-nickel alloy, in order to enhance the signal transmission characteristic and thermal transmission characteristics of the package. The leadframe includes a die pad 231 and a number of conductive leads 233. The conductive leads 233 are formed by either punching or etching on a metal sheet. Each of the conductive leads 233 includes a first terminal portion 235, a second terminal portion 236 and a connecting portion 237, and the connecting portion 237 interconnecting the first and second terminal portions 235, 236. The first and second terminal portions 235, 236 are spaced apart and aligned parallel to each other. The interconnecting portions 237 are slanted relative to the first and second terminal portions 235, 236. Correspondingly, the conductive leads 233 are divided into two groups. The two groups are symmetrically arranged and the conductive leads 233 in the same group are parallel to and spaced from each other. The die pad 231 is disposed between the two groups of the conductive leads 233, and a bottom surface of the die pad 231, and is level with the bottom surfaces of the second terminal portions 236 of the conductive leads 233 whilst a top surface of the die pad 231 is at a higher level than that of a top surface of each second terminal portions 236.

During injection molding, the plastic base 21 encapsulates the leadframe, wherein the die pad 231 is disposed in a middle portion of the base board 211 with the top and bottom surfaces thereof exposed through the base board 211, an upper surface of each first terminal portion 235 is exposed from the top surfaces of the sidewall portions without a slot 217 defined therein, for example, the top surfaces of the front and rear sidewall portions 2131, 2133, and each second terminal portion 236 are exposed from the bottom surface of the base board 211. The first and second terminal portions 235, 236 are both configured for electrically connecting with other electronic components, for example the first terminal portions 235 can be used to electrically connect to a chip and the second terminal portions 236 can be used to electrically connect with a printed circuit board (PCB), thereby transmitting signals from the chip to the PCB via the leadframe.

The image sensor chip 30 is received in the cavity 24, and is attached to the base board 211. A top surface of the image sensor chip 30 is arranged with an active area 301 and a number of contacts 302. The active area 301 is disposed in a middle portion of the top surface of the chip 30. The contacts 302 are divided into two groups, and the two groups of contacts 302 are symmetrically disposed and formed at regular intervals along a peripheral portion of the top surface of the chip 30.

The wires 50 can be made of a conductive material with good electric conductivity, such as gold or aluminum alloy. One end of each wire 50 is connected/joined with a respective contact 302 of the image sensor chip 30, and the other end of the wire 50 is connected/joined with a respective top surface of a first terminal portion 235 of the leadframe.

The holder 60 is constructed to include a seat portion 61, a cylinder portion 62 projecting from the seat portion 61, and a through hole 63 penetrating through the seat portion 61 and the cylinder portion 62. The holder 60 can has a one-piece shape, for example, in FIGS. 3 and 4, the seat portion 61 and the cylinder portion 62 is formed by injection molding. Alternatively, the holder 60 can be assembled from a separate seat portion 61 and a separate cylinder portion 62. The seat portion 61 is designed for housing the carrier 20 with the chip 30 mounted thereon. The seat portion 61 includes a transparent board 610 received in the through hole 63 to enclose an end where the cylinder portion 62 projects. The seat portion further includes a first step section 611 and a second step section 613, positioned opposite to the cylinder portion 62. An inner periphery of the first step section 611 has a dimension equal to that of an outer periphery of the carrier 20. An inner periphery of the second step section 613 has a dimension smaller than that of the outer periphery of the carrier 20. The second step section 613 includes a step surface 615 from which the first step section 611 extends. The step surface 615 has two recessed portion 617 defined therein for receiving the wires 50, and two ribs 619 projecting therefrom for engaging with the slots 217 of the carrier 20. The cylinder portion 62 is configured for receiving the lens module 70 therein, and has an internal thread formed thereon.

The seat portion 61 of the holder receives the carrier 20 mounted with the chip 30 therein, wherein the inner periphery of the first step section 611 is adhered to the outer periphery of the carrier 20, the step surface 615 of the seat portion 61 is adhered to the top surface of the sidewall 213, each recessed portion 623 receives a group of wires 50, each rib 619 of the holder 60 is adhered to and engaged with a corresponding slot 217 of the carrier 20, and the transparent board 610 is positioned above the active area 301 of chip 30.

The lens module 70 includes a barrel 71 and at least one lens 72 received in the barrel 71. The barrel 71 has an external thread formed on an outside thereof. The lens module 70 is received in the cylinder portion 62 of the holder 60, wherein the external thread of the barrel 71 engages with the internal thread of the cylinder portion 62, and the at least one lens 72 faces towards the active area 301 of the chip 30 to form an image on the active area 301.

In an alternative embodiment, the cylinder portion 62 can be omitted and the lens module 70 can be directly mounted to the seat portion 61. Furthermore, the lens module 70 can be omitted while a lens is received in the through hole 63 instead of the transparent board 610 to enclose the seat portion 61 and form a focused image on the active area 301 of the chip 30.

The base 21 of the carrier 20 is made of plastic material, which is much cheaper than ceramic, and the carrier 20 is formed by injection molding technology, which is a relative simple method for manufacturing the carrier 20, thus, the cost of the digital camera module 200 is accordingly decreased.

The leadframe of the carrier 20 is solid and substantially encapsulated by the base 21, so it is difficult for water vapor to penetrate into the package to pollute the chip 30, thereby enhancing the reliability of the digital camera module 200.

The top surfaces of the first terminal portions 235 of the leadframe act as connecting pads, accordingly there is no space restriction on the movement of wire bonding tools. Thus, the size of the carrier 20 can be sufficiently minimized to approach the size of the chip 30, and the volume of the digital camera module can also be minimized.

In addition, a relative small volume of the digital camera module 200 contains relatively little dust particles therein, the pollution and/or contamination of the active area 301 is reduced and the quality and reliability of the digital camera module 200 is much improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A digital camera module comprising:
a carrier, the carrier comprising a base and a leadframe, the base having a board, a sidewall extending from a top surface of the board and a cavity cooperatively defined by the board and the sidewall, the leadframe comprising a plurality of conductive leads, the conductive leads of the leadframe being embedded in the base and spaced from each other, each conductive lead having a first terminal portion exposed from a top surface of the sidewall of the base, a second terminal portion exposed from a bottom surface of the board, and an interconnecting portion connecting the first and second terminal portions;
an image sensor chip, the chip mounted on the base and received in the cavity, the chip having an active area and a plurality of contacts;
a plurality of wires, the wires electrically connecting the contacts of the chip and the first terminal portions of the leadframe;
a holder, the holder being mounted to the carrier to close the cavity of the carrier; and
a lens module, the lens module being received in the holder and being configured for guiding light to the active area of the chip.

2. The digital camera module as claimed in claim 1, wherein the leadframe is manufactured by punching or etching on a metal sheet, the base is made of plastic materials and encapsulates the leadframe via injection molding.

3. The digital camera module as claimed in claim 2, wherein the first and second terminal portions are parallel to and spaced from each other, and the interconnecting portions are slanted relative to the first and second terminal portions.

4. The digital camera module as claimed in claim 3, wherein the sidewall of the base comprises a front sidewall portion, a rear sidewall portion parallel to the front sidewall portion, a left sidewall portion, and a right sidewall portion parallel to the left sidewall portion, the conductive leads are divided into two groups which are symmetrically arranged, and the first terminal portions of the two group of the conductive leads are exposed from a pair of parallel sidewall portions.

5. The digital camera module as claimed in claim 4, wherein the sidewall further comprises a pair of slots, the two slots are defined in another pair of the parallel sidewall portions.

6. The digital camera module as claimed in claim 3, wherein the contacts of the chip are correspondingly divided into two groups which are arranged symmetrically on periphery of a top surface of the chip, and each group of the contacts is disposed near to a group of the first terminal portions of the conductive leads.

7. The digital camera module as claimed in claim 4, wherein the holder defines a seat portion for receiving the carrier, and the seat portion comprises a first step section and a second step section, and the second step section has a step surface from which the first step section extends from, and the first step section surrounds and is attached to an outer periphery of the sidewall of the base, the step surface is attached to the top surface of the base.

8. The digital camera module as claimed in claim 7, wherein the seat portion has a through hole defined therein, and the through hole is enclosed by the lens module.

9. The digital camera module as claimed in claim 7, wherein the holder further has a cylinder portion projecting from the seat portion, and the cylinder portion receives the lens module therein.

10. The digital camera module as claimed in claim 7, wherein the second step section has a pair of recessed portion defined therein, and the recessed portions receive the wires therein.

11. The digital camera module as claimed in claim 7, wherein the second step section has a pair of ribs projecting form the step surface, and the ribs engage with the slots of the sidewall of the base.

12. The digital camera module as claimed in claim 2, wherein the leadframe further comprises a die pad configured for dissipating thermal energy, and the die pad is embedded in a middle portion of the board with a top surface and bottom surface thereof exposed through the board.

13. The digital camera module as claimed in claim 1, wherein the cavity has a uniform cross section between the board and the sidewall.

14. The digital camera module as claimed in claim 1, wherein the lens module comprises barrel and at least one lens received in the barrel.

* * * * *